(12) United States Patent
Cavanna et al.

(10) Patent No.: US 7,760,530 B2
(45) Date of Patent: Jul. 20, 2010

(54) CONTENT ADDRESSABLE MEMORY ADDRESS RESOLVER

(75) Inventors: Vincent E. Cavanna, Rocklin, CA (US); Mark Gooch, Roseville, CA (US); John A. Wickeraad, Granite Bay, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 466 days.

(21) Appl. No.: 11/810,072

(22) Filed: Jun. 4, 2007

(65) Prior Publication Data

US 2008/0301362 A1    Dec. 4, 2008

(51) Int. Cl.
*G11C 15/00* (2006.01)
(52) U.S. Cl. .............. 365/49.17; 365/49.15; 365/49.16; 365/49.1; 365/49.18
(58) Field of Classification Search ................ 365/49.1, 365/49.18, 49.17, 49.15, 49.16
See application file for complete search history.

(56) References Cited

U.S. PATENT DOCUMENTS

| 6,775,166 | B2 * | 8/2004 | McKenzie et al. | 365/49.18 |
| 6,999,331 | B2 | 2/2006 | Huang | |
| 7,064,971 | B2 | 6/2006 | Shau | |
| 7,188,211 | B2 * | 3/2007 | Roth et al. | 711/108 |

* cited by examiner

*Primary Examiner*—Hoai V Ho
*Assistant Examiner*—Kretelia Graham

(57) ABSTRACT

Systems, devices, and methods, including executable instructions are provided for resolving content addressable memory (CAM) match address priority. One method includes retaining a first match address as the best match address. Subsequent match addresses are compared to the retained best match address, each match address being associated with a compare cycle during which a selected columnar portion of each CAM entry is compared to a corresponding portion of a search term. The best match address is updated as a result of the comparison.

20 Claims, 10 Drawing Sheets

CONTENT ADDRESSABLE MEMORY ADDRESS RESOLVER

BACKGROUND

Content addressable memory (CAM) is a useful device for executing table lookup operations. Particularly, because of the parallel lookup capability, a user can execute thousands or even millions of comparisons with one lookup operation.

For computer systems, CAM is widely used as the address lookup table for cache memory (called cache TAG), or as the paging translation look-aside buffer (TLB). For communication applications, CAM is widely used to support address lookup operations for routers. Recently, the rapid growth of networking systems has triggered strong demands for high density and high speed CAM devices. For networking applications, ternary content addressable memory (TCAM) is used to store various items such as quality of service (QoS) information, filter information, access control lists (ACL), etc. A current TCAM for networking application has 256K of 72 bit entries supporting 125 million lookups per second (LPS).

However, due to the parallel lookup operation, CAM devices require support logic, e.g., priority encoders, on their match outputs for determining the TCAM-line address of the stored data that best matches the comparison data. In order to maximize computational speed, follow-on priority encoding logic has been configured for parallel operation. One prior solution utilizes an M:1 priority encoder for an M-entry CAM, as well as M match output flops. As the quantity of entries in a CAM increases, complexity of support priority encoders increase at a faster rate than the number of entries, i.e., approximately M×log M. Increased priority encoder circuit complexity, increases design and manufacturing costs. In addition, significant circuit real estate is consumed by the support prioritizing logic, with physical size quickly becoming a limiting factor in continued expansion of current CAM systems to support maximum application performance. Efficient CAM application is challenging conventional CAM design methodologies.

DETAILED DESCRIPTION

Embodiments of the present disclosure include systems, methods, and computer readable media for content addressable memory (CAM) devices, and more particularly, to methods for effectively searching just a columnar portion of data stored using CAM integrated circuits (IC). As used herein a CAM can be either a binary CAM (BCAM) or a ternary CAM (TCAM). Some embodiments may include writing, to a CAM, multiple entries per CAM with multiple words per entry, the entries and constituent words of each entry arranged according to a pre-determined priority. Some embodiments include sequentially searching selected portions of CAM entries, e.g., a subset of CAM columns.

One embodiment of the present invention can include a method for resolving CAM match address priority. The method includes retaining a first match address as a best match address. Subsequent match addresses are compared to the retained best match address. The best match address is updated as a result of the comparison. Each match address is associated with a compare cycle during which a selected columnar portion of each CAM entry is compared to a corresponding portion of a search term.

As the reader will appreciate, various embodiments described herein can be performed by software, application modules, application specific integrated circuit (ASIC) logic, and/or executable instructions operable on the systems and devices shown herein or otherwise. "Software," as used herein, includes a series of executable instructions that can be stored in memory and executed by the hardware logic of a processor, e.g., transistor gates, to perform a particular task. Memory, as the reader will appreciate, can include random access memory (RAM), read only memory (ROM), non-volatile memory (such as Flash memory), etc.

An "application module" means a self-contained hardware or software component that interacts with a larger system. As the reader will appreciate a software module may come in the form of a file and handle a specific task within a larger software system. A hardware module may be a separate set of logic, e.g., transistor/circuitry gates, that "plug-in" as a card, appliance, or otherwise, to a larger system/device.

The embodiments of the present disclosure may be implemented in a stand-alone computing system or a distributed computing system. As such, FIGS. 1-7 are intended to provide a context for the description of the functions and operations of the present disclosure. Logic, suitable for carrying out embodiments of the present invention, can be resident in one or more devices or locations or in several devices and/or locations in a network.

Figure 1:
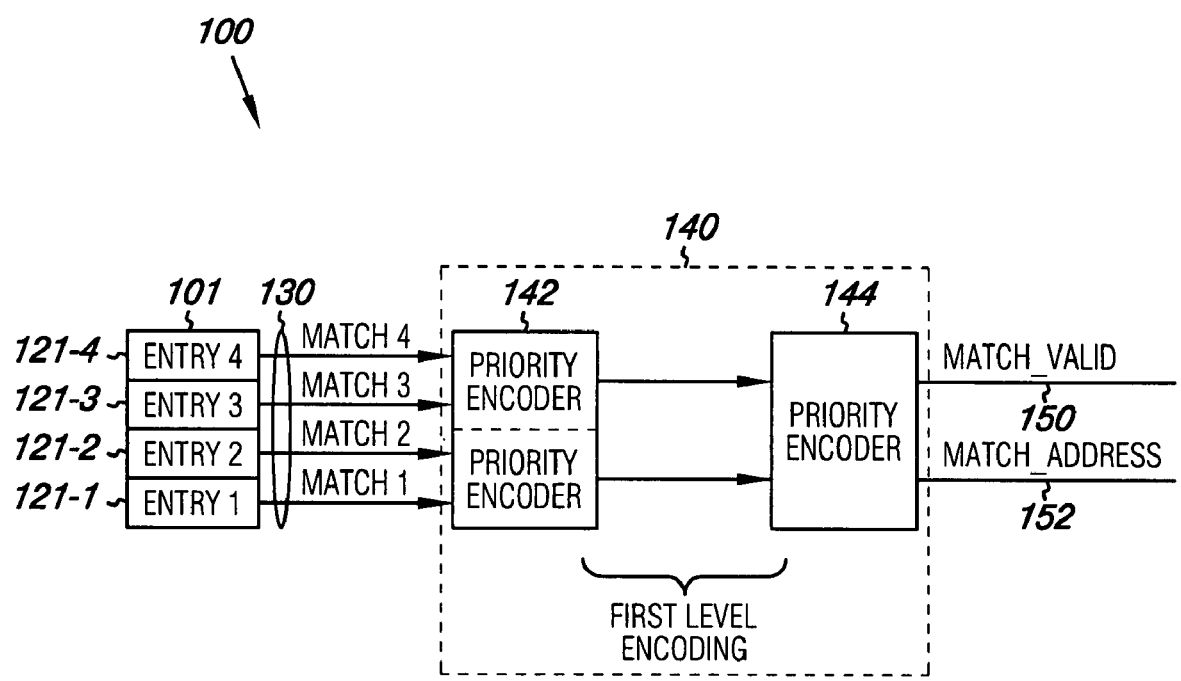
FIG. 1 illustrates a previous content addressable memory (CAM) system implementation arranged with one word per entry.

FIG. 1 illustrates a previous CAM system 100 arranged with one word per entry. As the reader will appreciate, CAM system 100 includes a CAM 101, and a priority encoder 140. CAM 101 is shown having four (4) entries, e.g., 121-1, 121-2, 121-3, and 121-4, with one (1) word per entry, for a total of four (4) words stored in the CAM. Having one word per entry, it is easily understood that search terms are of similar length to the entries, and that the entire entry is involved in the comparison to the search term for a match. Each entry is shown being coupled to a priority encoder 140 by one of a group of match lines 130, e.g., MATCH 1, MATCH 2, MATCH 3, and MATCH 4, corresponding to ENTRY 1, ENTRY 2, ENTRY 3, and ENTRY 4 respectively. Other details of the CAM are omitted for simplicity of illustration. Depending on the quantity of inputs to the priority encoder 140, i.e., outputs from the CAM, a priority encoder can consist of multiple stages of priority determination logic as represented in FIG. 1 by a first stage priority encoder 142 followed by a second stage priority encoder 144 to produce a MATCH_VALID output signal 150 and a MATCH_ADDRESS output signal 152.

Figure 2A:
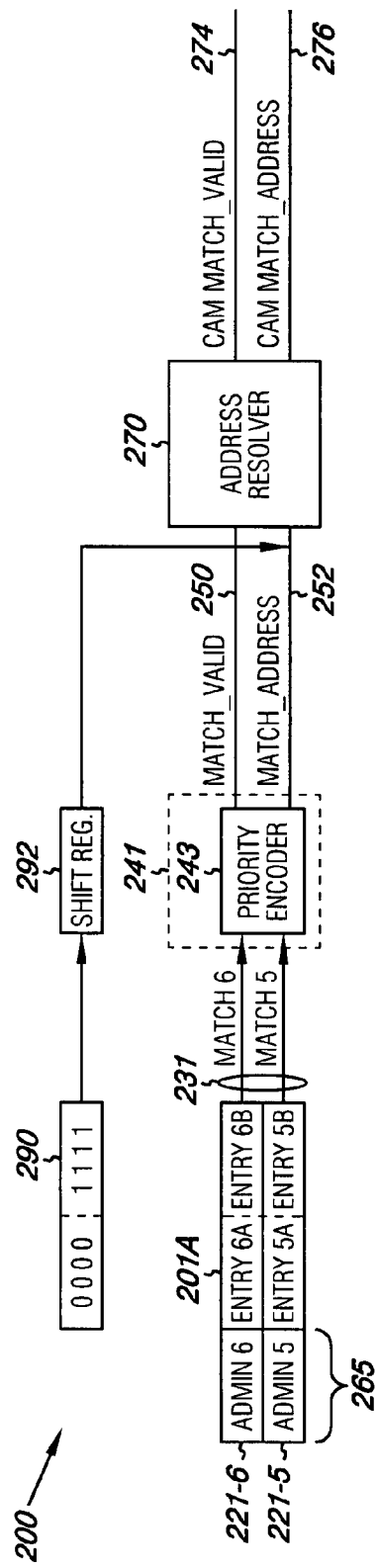
FIG. 2A illustrates a CAM system implementation arranged with multiple words per entry, with which embodiments of the present invention can be implemented.

FIG. 2A illustrates a CAM system 200 according to an example embodiment of the present invention, arranged with more than one word per entry, and shown having two (2) words, 5A/5B and 6A/6B, in each of two (2) entries, e.g., 221-5 and 221-6, for a total of four (4) words stored (plus additional administrative bits 265 per entry). Each entry has two portions arranged in columns, plus one or more columns of administrative information per entry. CAM system 200 includes a CAM 201A, a supporting priority encoder 241, and finally, an address resolver 270. Each CAM entry is shown being coupled to the priority encoder 241 by one of a group of match lines 231, e.g., MATCH 5 and MATCH 6, corresponding to words 5A/5B and 6A/6B respectively. Administrative bits 265, included in each entry, are used to provide additional information specific to the entry and/or individual word portions of each entry. As the reader will appreciate, the priority encoder 241 is shown having fewer encoding stages 243, corresponding to CAM fewer entries, than were represented in FIG. 1.

The priority encoder 241 outputs, MATCH_VALID 250 and MATCH_ADDRESS 252, are coupled to address resolver 270. In addition, information identifying the column effectively being searched is passed along with the search results to the address resolver 270. According to one embodiment of the present invention, mask information 290 for a particular compare cycle is passed through shift registers 292 to align with the MATCH_ADDRESS output of the priority encoder 243. Mask information 290 indicates which column was effectively searched, i.e., which column was permitted to impact the match results, leading to the generation of the corresponding highest priority MATCH_ADDRESS. Mask information 290 is generated for control as part of the process which controls CAM searching. The number of stages in the shift register corresponds to the CAM latency. Raw mask information 290 can be encoded into a column identifier, e.g., a column number, and this encoded column identifier can be combined with the MATCH_ADDRESS, e.g., as a least significant address bit(s), as the MATCH_ADDRESS is fed into the address resolver 270 for comparison according to a priority scheme. For example, with only two (2) columns shown in the CAM of FIG. 2A, only one (1) bit is required to encode which column was effectively searched associated with a particular match result. Address resolver 270 function is discussed in detail below; however, the outputs are CAM MATCH_VALID 274 and CAM MATCH_ADDRESS 276. Other CAM details are omitted for simplicity of illustration.

The quantity of words contained in CAM 201A is the same as the quantity of words contained in CAM 101, i.e., four (4). However, because the quantity of entries for CAM 201A are less, by half, than shown for CAM 101, there are half as many match lines. As a result, the priority encoder 241 logic necessary to ascertain priority of match outputs is also reduced, as indicated in FIG. 2A by having only one stage of priority encoding 243 to produce a MATCH_VALID output signal 520 and a MATCH_ADDRESS output signal 252.

Figure 2B:
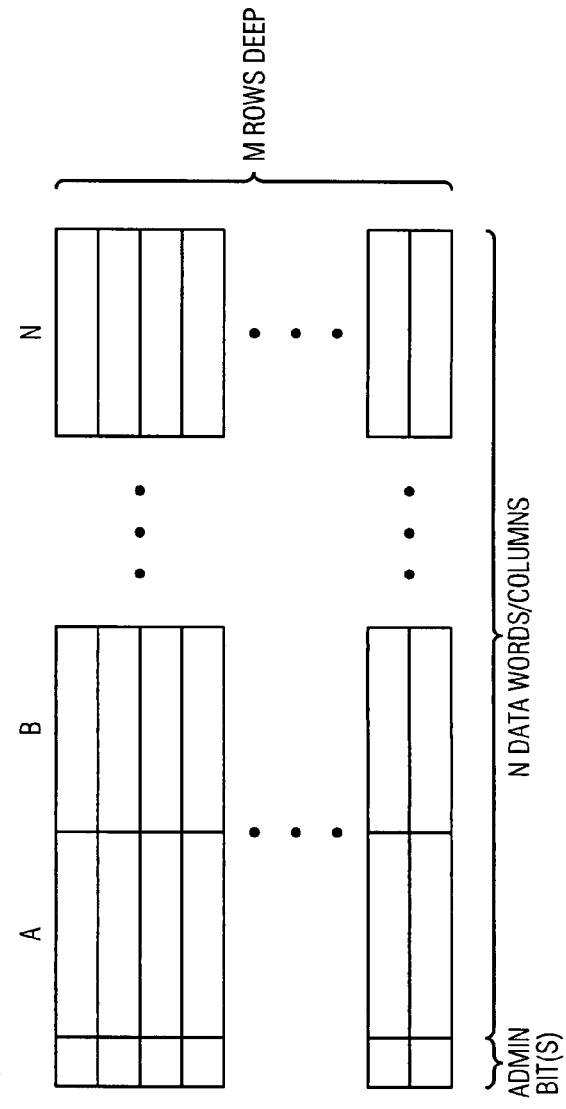
FIG. 2B illustrates a CAM arrangement having N words per entry and M entries, with which embodiments of the present invention can be implemented.

FIG. 2B illustrates a CAM arrangement 201B having N words per entry and M entries, with which embodiments of the present invention can be implemented. Ignoring administrative bits, the M entries of N words forms an M×N array of data words within CAM 201B. As the reader will appreciate, by increasing the quantity of words per CAM entry, the quantity of CAM entries can be reduced, which allows the complexity, and size, of the supporting priority encoder logic to be reduced. For example, CAM 201B requires a priority encoder significantly smaller and less complex than a CAM having M×N entries of one word each.

To realize the above-mentioned efficiency, i.e., having less priority encoder logic associated with a decreased quantity of CAM entries for a given quantity of words achieved by arranging CAM entries to contain multiple words, the CAM is configured to facilitate comparing a search term against the multiple words of an entry. A word can be a contiguous group of bit columns within an entry; however, the bits of an entry comprising a word need not be located contiguous or adjacent one another, and in fact may be scattered across an entry, i.e., row. A word is simply a collection of bits of an entry that correspond to a particular mask bit pattern. These bits form columns of bits when extended across multiple entries. According to one embodiment of the present invention, entry configuration and individual compare validity are managed to the word level, i.e., to the sub-entry level, rather than just to the entry level. Administrative bits, included in each entry, are used to administratively manage a searching process to the sub-entry level. In addition, a CAM is configured such that these individually-searchable words of an entry are selectable, in order to control the portion of the CAM being searched. This is accomplished by arranging data words of each entry into columns, and using mask lines to select or de-select particular columns of words for simultaneous comparison against a search term. These, and other features, are discussed further in co-pending, co-assigned U.S. patent application Ser. No. 11/787,588, entitled, "Content Addressable Memory", filed on Apr. 17, 2007, having common inventorship. The same is incorporated herein in full by reference.

Figure 3A:
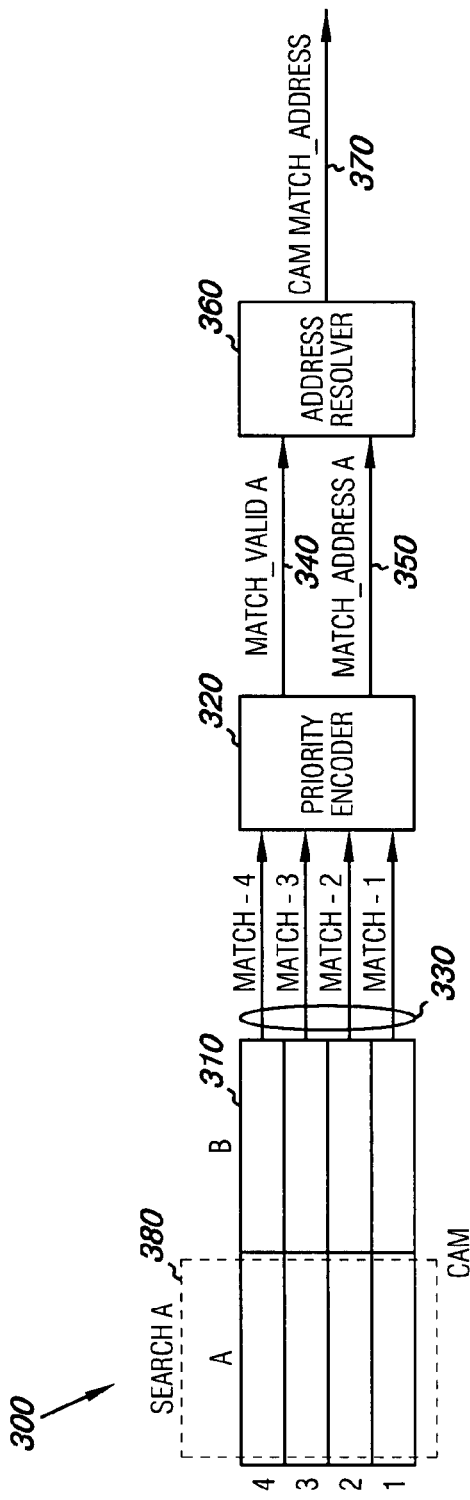
FIG. 3A illustrates a first columnar portion of a CAM system, according to an embodiment of the present invention.

FIG. 3A illustrates a first columnar portion of a CAM system 300, according to an embodiment of the present invention. This first columnar portion of a CAM system 300 is effectively searchable, although as the reader will come to appreciate, the entire CAM is actually involved in compare operations. CAM system 300 is arranged with two words per entry. As the reader will appreciate, CAM system 300 includes a CAM 310, and a priority encoder 320. The internal levels of priority encoding in the priority encoder 320 are omitted from illustration in FIG. 3A. CAM 310 is shown having four (4) entries, with two (2) words per entry, for a total of eight (8) words stored in the CAM 310. Each entry is divided into an "A" and a "B" word, arranged to form an "A" and a "B" column. Each entry is shown being coupled to a priority encoder 320 by one of a group of match lines 330, e.g., MATCH 1, MATCH 2, MATCH 3, and MATCH 4, corresponding to entries 14 respectively. Outputs of the priority encoder 320 include a MATCH_ADDRESS 350 and a MATCH_VALID 340 to indicate whether or not the MATCH_ADDRESS 350 is valid. Those having ordinary skill in the art will recognize that if no match exists, an invalid match address can be presented at the MATCH_ADDRESS output 350, and will be so indicated by the corresponding MATCH_VALID output 340. The MATCH_ADDRESS output 350, and MATCH_VALID output 350 are coupled to an address resolver 360. Other details of the CAM are omitted for simplicity of illustration of this embodiment of the present invention.

FIG. 3A shows the effective first search area, e.g., SEARCH A 380, including the columnar portion of CAM 310 containing the first word per entry, e.g., entry 1A, entry 2A, entry 3A, and entry 4A. Ignoring administrative bits for the moment (not shown in CAM 310), and assuming each entry is N-bits wide, then each of the two (2) words per entry must be less than N bits wide respectively, i.e., words are some portion of an entire entry. For example, if the entry is evenly divided then each word will be N/2 bits wide; however, word widths are not so limited, and may be unevenly apportioned, e.g., word "A" being N/3 and word "B" being 2N/3 in width, etc.

While SEARCH A 380 is shown as being the effective search area, to effectively search only the words in column "A," each entire entry is involved in the compare operations comprising each search of the CAM; however, the comparison of the portion of each entry of the CAM outside of the selected column "A," e.g., SEARCH A 380, is disregarded in determining a match. In this manner then, only the SEARCH A 380 columnar portion of the CAM is effective in impacting the search results, just the same as if only that portion of the CAM were being searched in isolation. Therefore, it is to be understood that references made herein to searching a columnar portion of the CAM are to mean effectively searching that portion of the CAM by the method of ignoring other portions of each entry during each search of the entire CAM as set forth in this disclosure.

Before comparing the search term to each entry of CAM 310, each of the match lines 330, e.g., MATCH 1, MATCH 2, MATCH 3, and MATCH 4, corresponding to entry 1, entry 2, entry 3, and entry 4, are pre-charged to indicate a match. The SEARCH A portion 380, i.e., columnar portion, of each entry of CAM 310 is "selected" by appropriate application of mask lines to prevent results of compares in the portion of the CAM not selected, e.g., not the portion of each entry included in SEARCH A 380, from discharging the match line to indicate non-match. In this manner, only compares of the search term within the SEARCH A portion of each entry of CAM 310 are enabled to discharge the respective match lines if a match does not occur. Therefore, the match line output for each respective entry depends only on the compare involving the search term to the portion each entry within the SEARCH A 380 portion of CAM 310. These, and other features, are discussed further in co-pending, co-assigned U.S. patent application Ser. No. 11/810,124, entitled, "Content Addressable Memory", filed on even date herewith, and having common inventorship. The same is incorporated herein in full by reference.

If the selected columnar portion of a particular entry matches the corresponding portion of the search term, and a match is maintained, the corresponding match line for that entry will remain charged to indicate a match as if the entire entry matched in a conventional CAM. If more than one entry, i.e., selected word, in a columnar compare matches the search term, several match lines will indicate matches, and the follow-on priority encoder 320 determines the highest level match for that search using conventional methodologies. In this manner, the MATCH_VALID 340 and MATCH_ADDRESS 350 outputs of the priority encoder (shown as MATCH_VALID A and MATCH_ADDRESS A in FIG. 3A to represent the outputs associated with effectively searching column A) indicate the highest priority match of a search, if any, of the SEARCH A portion 380 of entries of CAM 310 compared to the search term. The MATCH_VALID 340 and MATCH_ADDRESS 350 outputs of the priority encoder are pipelined to an address resolver 360, which retains valid match information, if any, until it receives subsequent higher priority match information, until a new search is initiated, or until the address resolver is otherwise reset, as described in more detail below.

Figure 3B:
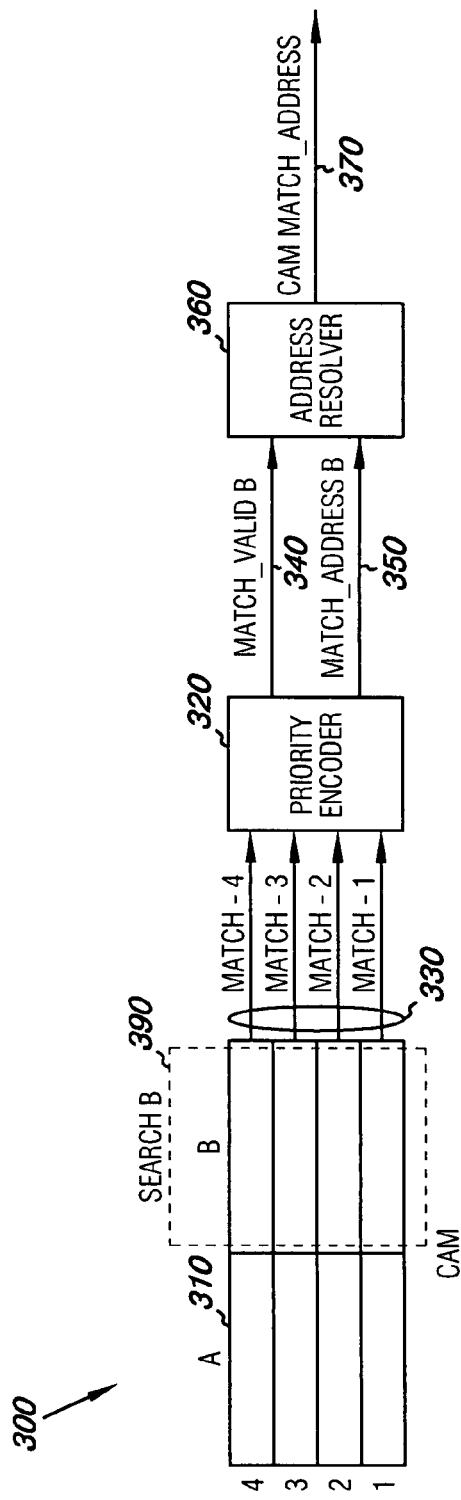
FIG. 3B illustrates a second columnar portion of a CAM system, according to an embodiment of the present invention.

FIG. 3B illustrates a second columnar portion of a CAM system, according to an embodiment of the present invention. Subsequently, and similarly, match lines 330 are pre-charged again in preparation for a new search in which the SEARCH B portion 390 of each entry of CAM 310 will be of interest. The SEARCH B portion 390 of each entry of CAM 310 is "selected" by appropriate application of the mask lines to prevent results of compares in the portion(s) of the CAM not selected, e.g., not the SEARCH B portion 390, from discharging the match line to indicate non-match. In this manner, during this second compare cycle, only compares of the corresponding portion of the search term to the columnar SEARCH B portion 390 of each entry of CAM 310 are now allowed to discharge the respective match line output if not matching. Therefore, the match line output for each respective entry effectively depends only on the compare involving the columnar SEARCH B portion 390 of each entry of CAM 310.

If the columnar portion of a particular entry included in the SEARCH B portion 390 matches the corresponding portion of the search term, and a match is maintained, the corresponding match line for that entry will remain charged as if the entire entry matched. If more than one word in an effective columnar compare matches the corresponding word portion of the search term, several match lines will indicate matches, and the follow-on priority encoder 320 determines the highest level match for the SEARCH B columnar search using conventional methodologies. Again, the entire CAM is involved in the compare operations of each search; however, only the compares occurring within the selected columnar portion(s) are able to impact the match results, thus effectively implementing a columnar search of only the SEARCH B portion 390. In this manner, the MATCH_VALID 340 and MATCH_ADDRESS 350 outputs of the priority encoder 320 now indicate the highest priority match, if any, of an effective search of the portion of entries included in the SEARCH B portion 390 of CAM 310. These second MATCH_VALID 340 and MATCH_ADDRESS 350 outputs of the priority encoder 320 are again pipelined to the address resolver 360. The address resolver 360 determines the relative priority between the match information from the search of the first columnar portion, e.g., SEARCH A 380, or the match information from the search of the second columnar portion, e.g., SEARCH B 390, based on a 2-dimensional priority scheme used to arrange the data words in CAM 310 (discussed below in association with FIG. 4). The address resolver CAM MATCH_ADDRESS output 370 reflects the highest priority match information after comparison of the two matches, one from each of the two searches, e.g., search A and search B.

According to one embodiment of the present invention, the address resolver CAM MATCH_ADDRESS output 370 is cleared at the initiation of a new search. According to another embodiment of the present invention, information identifying the column being effectively searched is associated with each particular MATCH_ADDRESS output 370, and the address resolver 360 is programmed to save the match results associated with certain columns, e.g., a first column, associated with the first compare of a new search. According to another embodiment of the present invention, the address resolver 360 is programmed to recognize the match results associated with the last column of a search in order to indicate final results, and optionally, re-initialize the address resolver 360 for a new search thereafter. Other methods, such as counting a pre-determined number of columns included in a search, or counting a pre-determined number of clock cycles after initialization, or keying off a pre-determined search result to indicate beginning or end of a search, as well as other synchronizing methodologies are contemplated to manage address resolver 360 operations in alignment with CAM search routines.

Thus, all the words of CAM 310 are effectively searched, one word per entry per search, using two sequential columnar searches, resulting in a series of sequential priority encoder outputs corresponding to the sequence of searches. These priority encoder outputs are pipelined out of the priority encoder 320 on subsequent compare cycles after an initial first search result latency. According to one embodiment of the present invention, priority encoder outputs are pipelined out of the priority encoder 320 on successive clock cycles after an initial, i.e., first, search result latency. However, it is not necessary that the series of priority encoder outputs be clocked out contiguously since identifying information corresponding to the column effectively being searched is tracked along with the corresponding match results. Priority encoder outputs may be pipelined out of the priority encoder 320 separated by multiple clock cycles as long as the compare data from the final comparison cycle, e.g., from the effective search of the last column in a search sequence, is so identified to the address resolver. Match "results" between compare cycles are indicated to be invalid. As illustrated in FIGS. 3A and 3B, CAM 310 has two (2) words per entry, and so separate searches involving two columnar areas of the CAM occur in order to effectively search the entire CAM 310. Thus, two (2) search results are generated by the priority encoder 320.

Additional logic, e.g., an address resolver 360, is used to ascertain which, if any, of the two sequential match outputs from the priority encoder 320 represent the highest priority output for the entire CAM 310. The result is an overall best match from the series of sequential searches. In this manner, a CAM having longer latency to reach a final, overall search result can be exchanged for an associated smaller priority encoder circuit footprint of less complexity than would be required for simultaneous priority encoding of all entries of a CAM arranged in one large column, i.e., a CAM arranged with one (1) word per entry. Applying embodiments of the present invention to applications having time available to sequentially process a series of searches, each effectively searching only a columnar portion of a CAM, offers distinct advantages in support circuit complexity reduction, space minimization, and accompanying cost savings.

Implementations of the present invention can be expanded to incorporate any number of words per entry, and words are not limited to be uniform in length within an entry. For example, a CAM entry could be partitioned into four (4) words per entry, the words being arranged in four (4) columns. Thereafter, four (4) columnar searches would search all words of the CAM, and result in four (4) sequential MATCH_VALID and MATCH_ADDRESS outputs from the priority encoder 320. Nor are embodiments of the present invention limited to effectively searching only one (1) contiguous column within an entry. For example, mask lines can be used to simultaneously select a columnar data word of each entry plus certain administrative bits associated with that data word, which may, or may not, be located contiguously to the selected data word. According to another example embodiment of the present invention, data words for searching may be comprised of two constituent, smaller, data words. For example, a CAM may be arranged to have four (4) 32-bit words per entry, the 32-bit words being arranged in columns. However, searches of 64-bit words are possible by selecting two (2) columns of 32-bit words. The selected columns mat be located adjacent one another; however, implementation of embodiments of the present invention is not so limited. The columnar portions of a CAM selected for searching by appropriate masking need not be located adjacent one another in one contiguous bit string. Thus a effectively searching a columnar portion of the CAM does not limit that columnar portion to one column of CAM cells, nor to a contiguous column of CAM cells. Administrative bits can be involved in enabled, i.e., not masked, compare operations for example.

According to an example embodiment of the present invention, the number of words, i.e., columns, into which an entry is divided for searching is variable, and can be adjusted from one search to another by modifying the mask used to enable and disable columns of cells from participating in a match determination during a particular compare cycle. According to one example embodiment of the present invention, administrative bits can include information on the entry configuration as well, e.g., to specify the quantity of words, the size of words, or an arrangement of words. Entry configuration information can be passed to the address resolver 360 as necessary to manage the match results resolution process. Certain entry configuration can be derived from column mask bit patterns as well. According to an example embodiment of the present invention, information represented by the column mask bits are passed to the address resolver 360, from the CAM control logic, by logic that is in parallel with the CAM search results outputs. For example, a column mask bit pattern associated with a compare cycle can be encoded as column information, associated with the compare cycle match results, and passed to the address resolver 360 as part of the MATCH_ADDRESS.

Figure 4:
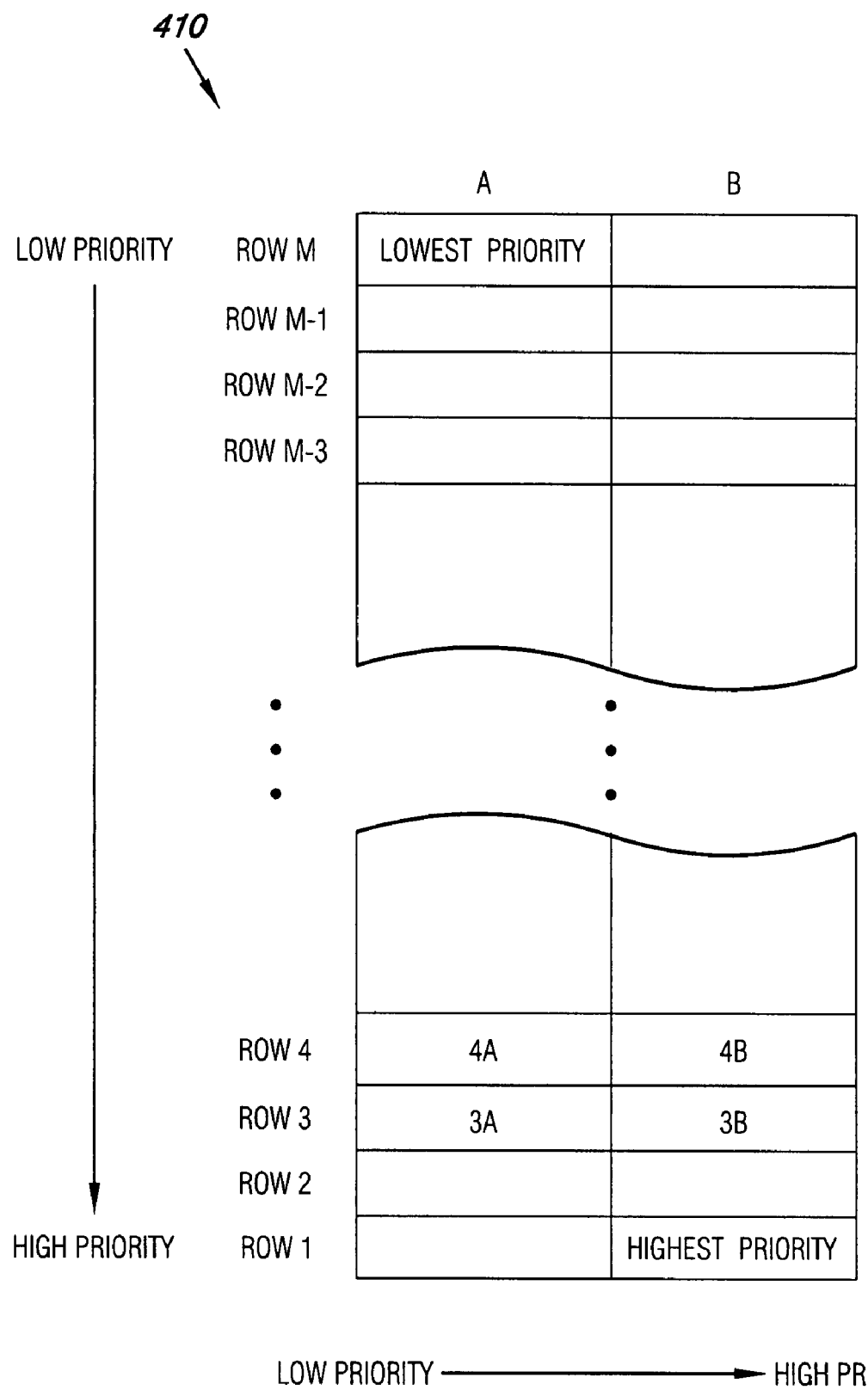
FIG. 4 illustrates a CAM data arrangement having searchable words arranged by priority in two dimensions, according to an embodiment of the present invention.

FIG. 4 illustrates a CAM data arrangement 410 having searchable words arranged by priority in two dimensions, according to an embodiment of the present invention. CAM data arrangement 410 is shown to be a two-dimensional array of words, having M entries, i.e., logical or physical rows, with two (2) words per entry, i.e., logical or physical columns. The words in each dimension are arranged in priority order, for example, the word located at column A, row 1 is of higher priority than the word located at column A, row M. Similarly in the other dimension, the word located at column B, row 1, is of higher priority than the word located at column A, row 1. In this manner, a two-dimensional priority scheme is established. For CAM data arrangement 410, the highest priority word is located, logically or physically, at row 1 of column B, and the lowest priority word is located, logically or physically, at row M of column A, as indicated in FIG. 4.

Within the above-described framework of words being arranged in priority order within both rows and columns, several data arrangements satisfying the criteria of words within a given row or column be arranged in a priority order are possible. For example, beginning with the lowest priority word in row M of column A, successively higher priority words can be written down column A first, and then down column B, i.e., the word in row M of column B is the next highest word after the word in row 1 of column A. This priority sub-scheme is referred-to herein as "down-over-down" priority. Alternatively, again beginning with the lowest priority word in row M of column A, successively higher priority words can first be written across a row, i.e., the word located at row M of column B is the next highest priority word after the word located in row M of column A, and the word located at row M−1 of column A is the next highest priority word after the word located in row M of column B. This priority sub-scheme is referred-to herein as "over-down-over" priority. Other sub-scheme data arrangements are also possible, particularly as additional columns of words are added.

The distinction in the above two example arrangements becomes important in establishing priority between words "geographically," physically or logically, in a multi-dimensional array when words are not located in the same row, or column. For example, the relative priority between the word located in row 3 of column A, e.g., "3A," and the word located in row 4 of column B, e.g., "4B." The word located in row 3 of column A is located in a higher priority row, but in a lower priority column. If words are arranged in "down-over-down" priority, the word located in row 4 of column B will be of higher priority than the word located in row 3 of column A. However, if words are arranged in "over-down-over" priority, the word located in row 3 of column A will be of higher priority than the word located in row 4 of column B. The quantity of 2-dimensional priority hierarchy permutations increases as the quantity of words within a given dimension increases. The most common arrangement is the "over-down-over" priority since entries are typically, written in their entirety at one time. Once a 2-dimensional priority scheme is set for arranging the data words into a CAM array, that same priority scheme can be used to decipher priority based on "geography," and is implemented by the address resolver, e.g., 360.

Figure 5:
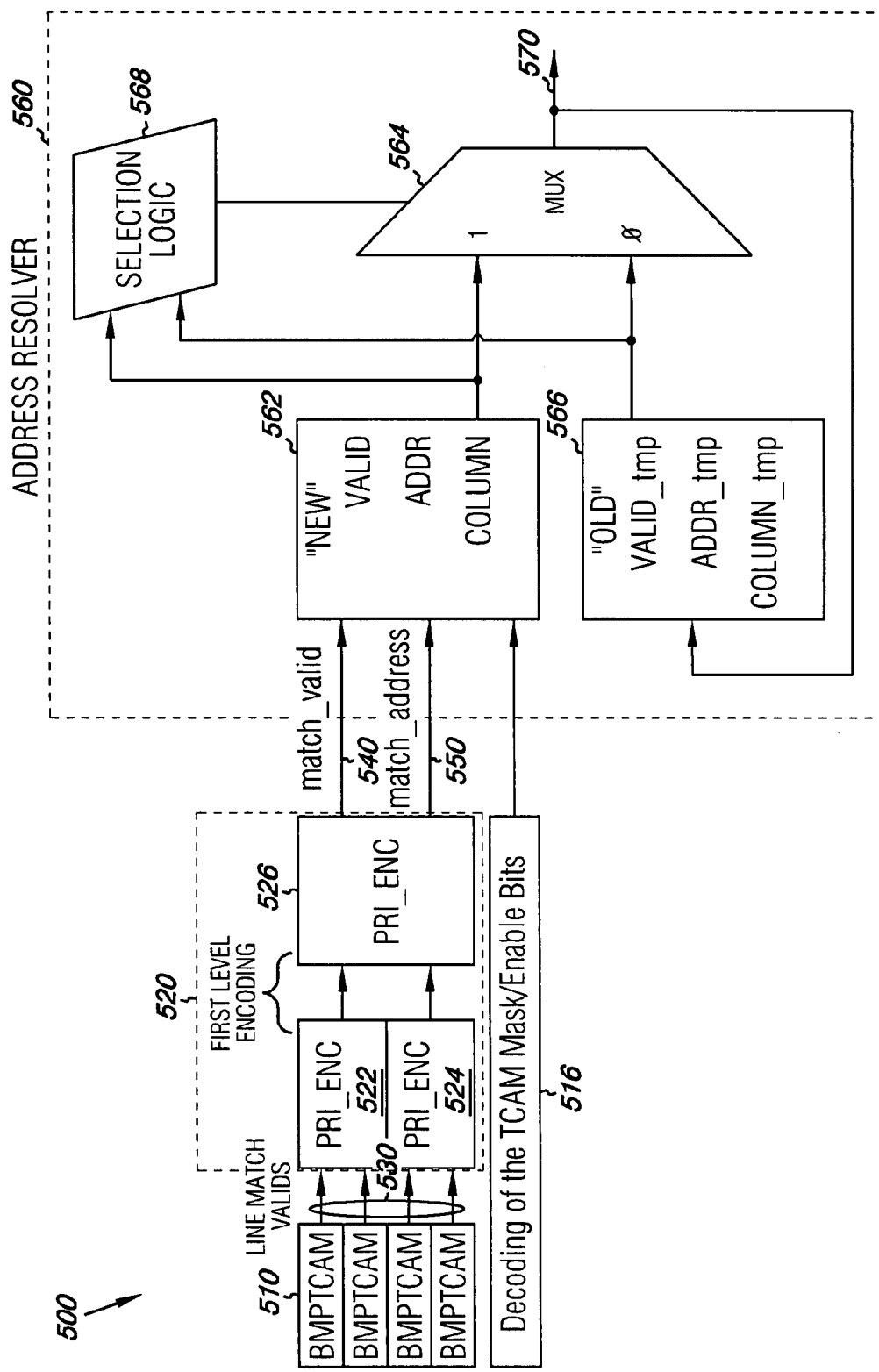
FIG. 5 illustrates a CAM system having a sequential columnar search address resolver, according to an embodiment of the present invention.

FIG. 5 illustrates a TCAM system 500 having a sequential columnar match address resolver 560, according to an embodiment of the present invention. Although not specifically delineated, TCAM system 500 is arranged with multiple words per entry, as indicated by entries being "BMPTCAM" (Best Match Prefix TCAM). As the reader will appreciate, TCAM system 100 includes a TCAM 510, and a priority encoder 520. TCAM 510 is shown having four (4) entries, but is not so limited to this configuration. Each entry is shown being coupled to a priority encoder 520 by one of a group of match lines 530, corresponding to each respective entry. Other details of the TCAM are omitted for simplicity of illustration, including the administrative bit portion of each entry. Depending on the quantity of inputs to the priority encoder 520, it can consist of multiple stages of priority determination logic as illustrated in FIG. 5 by a first level of priority encoding, e.g., by first stage priority encoders 522 and 524, followed by a second stage priority encoder 526, to produce a MATCH_VALID output signal 540 and a MATCH_ADDRESS output signal 550.

The MATCH_VALID output signal 540 and a MATCH_ADDRESS output signal 550 are coupled to the address resolver 560. Match information corresponding to each search are pipelined from the priority encoder 520 to the address resolver 560 and stored in a new input ("new") register 562. Column information, i.e., identifying the TCAM column searched to produce the corresponding search results, may be communicated as a field of the MATCH_ADDRESS information, or may be communicated by a separate path, such as by determined from decoding of the TCAM mask/enable bits 516. The "new" register is coupled to one input of a multiplexer 564. An "old" register 566 is coupled to the second input of the multiplexer 564. The input to the "old" register 566 is coupled to the output of the multiplexer 564, such that the "old" register 566 retains the previous multiplexer output. The multiplexer 564 is controlled by selection logic 568, which evaluates and selects as the next multiplexer output either the previous multiplexer output from the "old" register 566 or the latest match information from the new input register 562.

The process of searching columnar portions of CAM entries having multiple words per entry, and sequentially pipelining match results to an address resolver was described in conjunction with FIGS. 3A and 3B. Searching in a columnar fashion, a CAM having its data words arranged according to a 2-dimensional priority scheme (as previously discussed in conjunction with FIG. 4), results in columnar match information being pipelined to the address resolver, i.e., match priority determined from compares between a selected columnar portion of the CAM and a corresponding portion of the search term.

When a search of TCAM 510 is initiated, the multiplexer output drives the result of the current TCAM search. If there is no match, the result indicated as invalid. If a match is found, the result is indicated to be a new valid result. TCAM mask/enable bits 516 indicate to the address resolver 560 that the results being pipelined are from an initial, i.e., first columnar, search of the TCAM 510. This initial search match information is placed in the "new" register 562, and the selection logic 568 is programmed to select the new register input after the initial columnar search, e.g., after address resolver 560 initialization. Thus, the match information from the initial columnar search appears at the multiplexer output 570, and is clocked into the "old" register 566 as well. The multiplexer output 570 reflects the highest priority match from the TCAM searching, albeit based on the results of only a first columnar search.

As a second columnar search is conducted of the TCAM 510, the admin/mask/enable bits communicate the event to the address resolver 560. Results of the second columnar search are again pipelined to, and presented as "new" match information. The new match information 562 may optionally be placed in a "new" register 562, as illustrated in FIG. 5; however, according to one embodiment of the present invention, the new match information is only needed for one (1) clock cycle, and therefore need not actually be stored in a register. In fact, doing so would slow down the compare process unnecessarily by the clock cycle(s) needed to store and retrieve information into and out of the register. Now, the old register 566 holds the previous highest priority match information, e.g., from the first columnar search, and the new register 562 holds the highest priority match information from the latest, e.g., second, columnar search. If the match information from the first columnar search and stored in the old register 566 is invalid, the selection logic selects the new register input to pass through the multiplexer 564. However, if the match information held in the new register 562 and the old register 566 are both valid, the selection logic compares the new and old match information to determine which is relatively higher priority according to the 2-dimensional priority scheme used to arrange data words into the TCAM 510, and selects the higher priority of the two valid match addresses, which is communicated through to the output of the multiplexer 570, and in turn, once again clocked into the old register 566 to be retained for further similar comparisons of match information. Thus the old register 566 reflects the highest priority match information thus far. This process continues on for subsequent columnar searches, the highest priority match information from the latest columnar search being compared to the highest priority match from all the previous columnar searches thus far. If the newest columnar search yields a higher priority match information, the new highest priority match information replaces the previous highest priority match information at the output 570 of the multiplexer 564 and in the old register 566; however, if the newest columnar search does not yield a higher priority match information than the previous highest priority match information from all of the past columnar searches, then the previous highest priority match information held in the old register 566 is retained for further comparison.

According to one example embodiment of the present invention, TCAM 510 is arranged according to the 2-dimensional priority scheme set described in conjunction with FIG. 4, and the columnar searches are performed sequentially from the lowest priority column to the highest priority column, i.e., from left to right. The selection logic comparison can then be limited to a row priority, similar to priority encoder operation.

According to one example embodiment of the present invention, the selection logic determines if the new match information held in the new register 562 includes an address row which is equal to or lower than the match address held in the old register 566, than the new match information is of higher priority than the old highest match information (assuming over-down-over sub-priority). Since newer match information will be from columns located to the right of older match information, if the same row is returned with the newer match information, it will be of higher priority.

FIGS. 6A-D illustrate a sequential columnar search address resolver 600, according to an embodiment of the present invention. The address resolver includes a selection portion 642 shown principally in FIGS. 6A and 6B, and a timing portion 644, shown principally in FIGS. 6C and 6D.

Figure 6A:
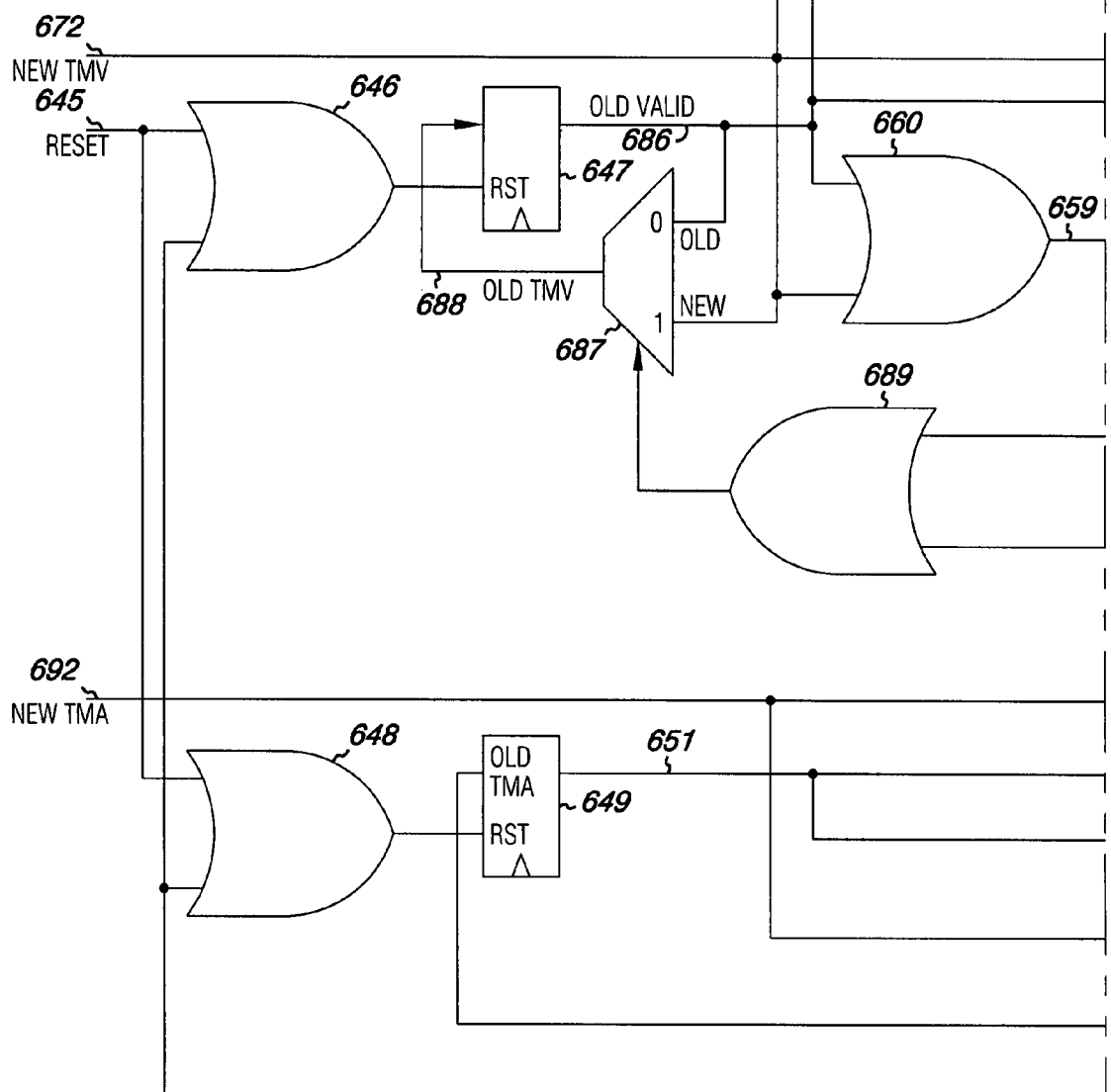
FIGS. 6A-D illustrate a sequential columnar search address resolver, according to an embodiment of the present invention.

FIG. 6A includes circuitry for initializing the address resolver 600 in preparation for a new TCAM search, which can occur in one of two ways. First, when a RESET signal 645 is applied to OR gates 646 and 648, the output of OR gate 646 being coupled to the reset input of flop 647 to clear the old TCAM MATCH_VALID ("OLD VALID") output 686. The output of OR gate 648 is coupled to the reset input of flop 649 to clear the old TCAM MATCH_ADDRESS ("OLD TMA") output. The second method to clear and initialize the address resolver 600 is by the generation of a MATCH_VALID output 670 from the address resolver 600. The MATCH_VALID output 670 is coupled back as the second input to each of OR gates 646 and 648 respectively; thus causing the same resetting consequences as described above for the RESET signal 645 when either output is asserted. The MATCH_VALID output 670 is generated after all sequential columnar search results have been processed by the address resolver 600 to indicate that the match address then present on the MATCH ADDRESS output 698 is the final result of the series of TCAM searches, as described further below.

The address resolver 600 has a processing cycle corresponding to a series of TCAM searches of words stored in a portion of an associated TCAM (the TCAM is repeatedly searched, but only unmasked words within the selected columns are able to contribute to match results). Multiple searches are required to effectively search all data words of the TCAM. For example, if a TCAM is defined into having N columns of data words, then N columnar searches are needed to search all data words of the TCAM, and N columnar search matches are pipelined to the address resolver 600 to determine the TCAM overall best match from among the columnar best matches. As previous discussed, a columnar search compares an entire entry to a search term; however, only portions of each entry within the selected columnar portion effectively matter to the compare operation since TCAM cells outside the selected columnar portion are masked to a "don't care" state such that they are prevented from discharging the pre-charged match outputs. According to one embodiment of the present invention, each additional TCAM columnar search takes one (1) clock cycle to accomplish. There is some latency inherent in obtaining the first columnar search result, i.e., first columnar match information.

Figure 6B:
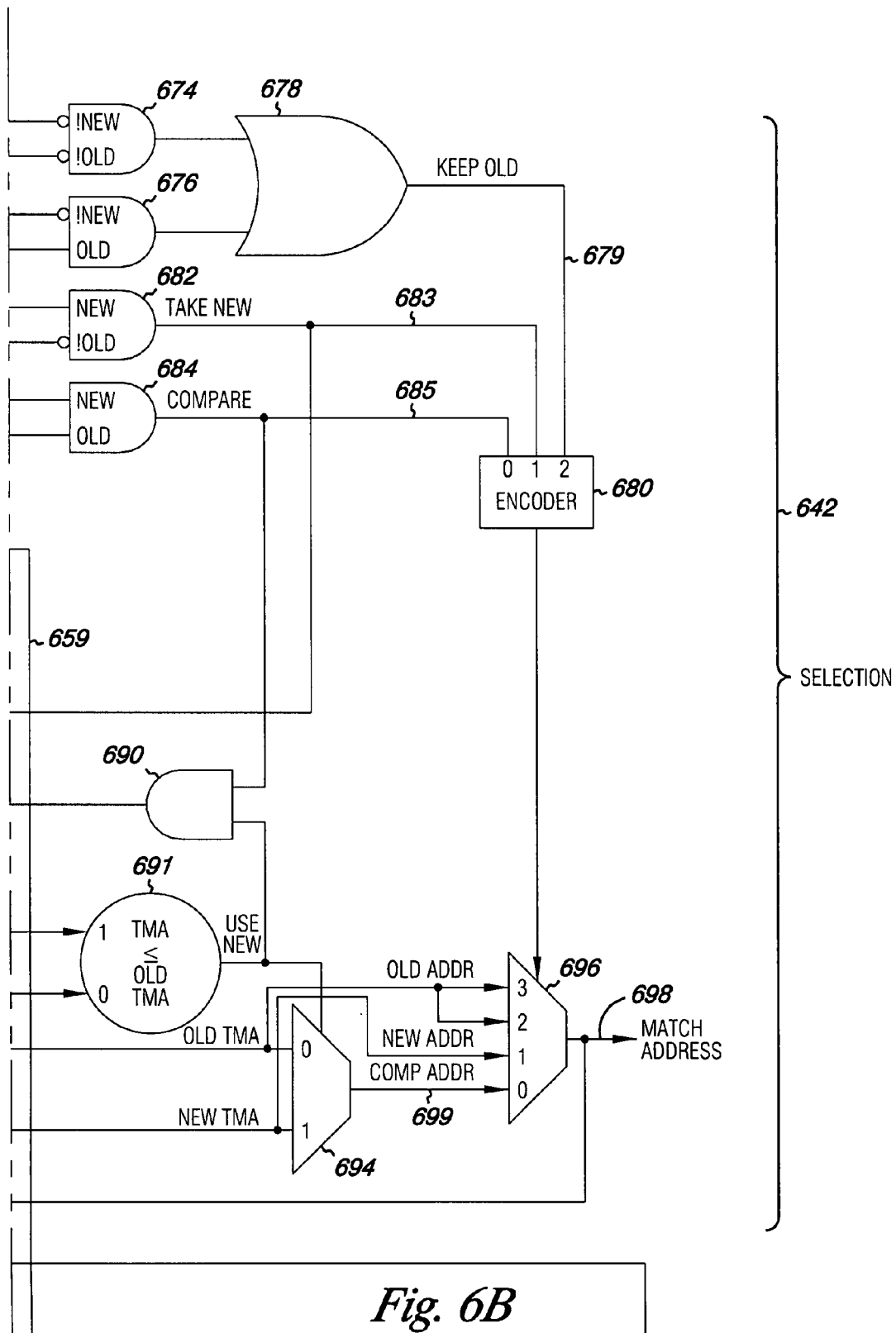
Figure 6C:
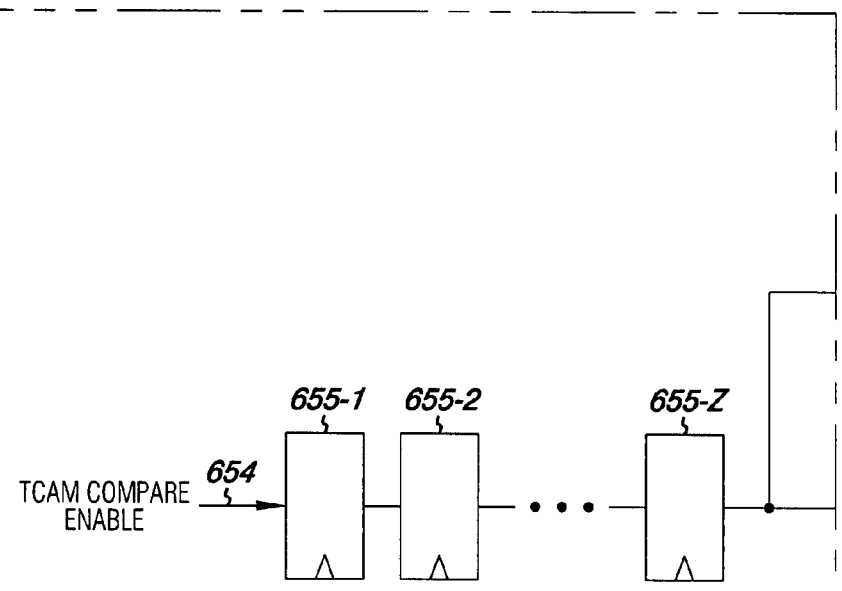
Figure 6D:
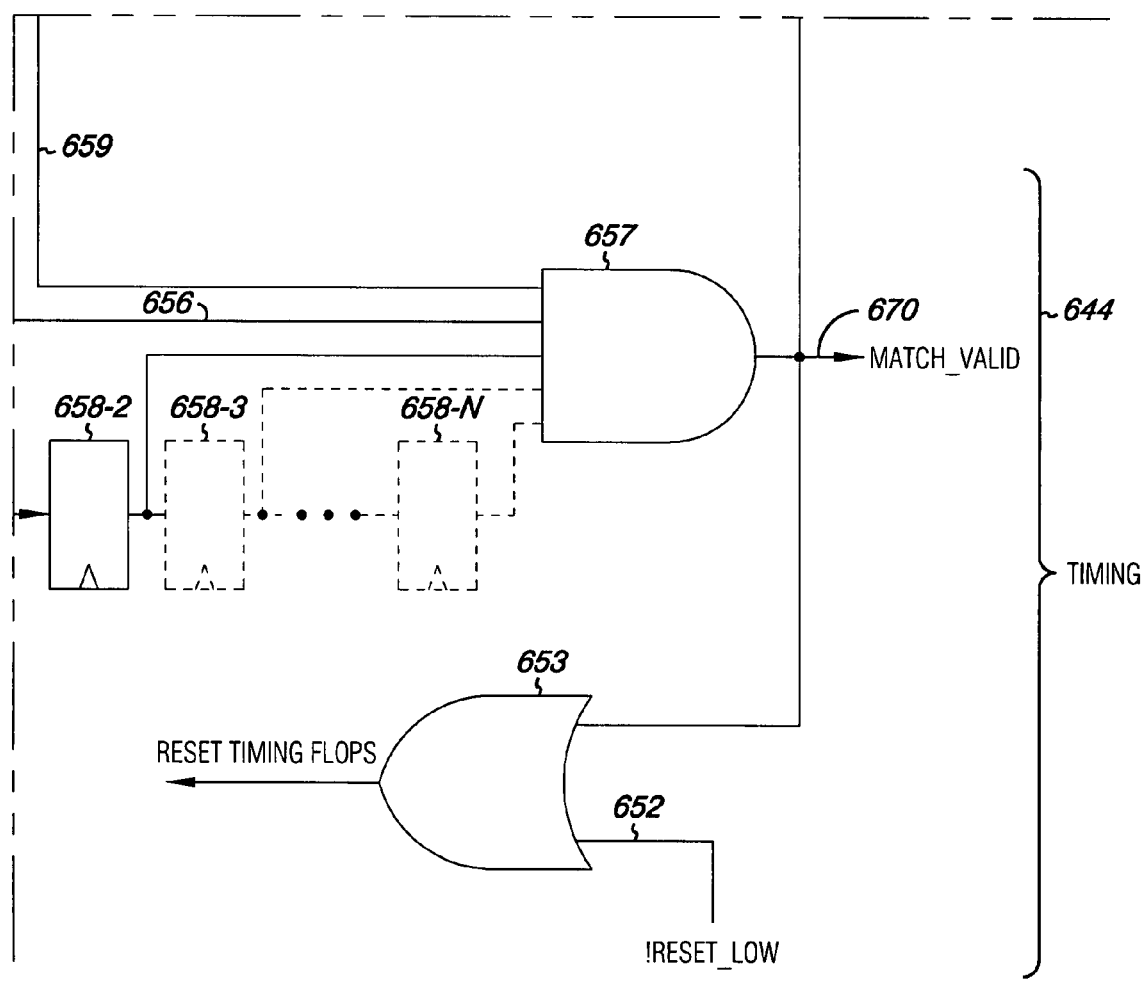

As shown in FIG. 6C, a first series of flops, e.g., 655-1, 655-2, . . . , 655-Z, are coupled to the TCAM (not shown) to receive a TCAM compare enable signal 654. Address resolver timing is synchronized to the TCAM search initiation. The TCAM compare enable signal 654 is presented to the TCAM to initiate a search, and simultaneously presented to a first series of flops, e.g., 655-1, 655-2, . . . , 655-N. The quantity of flops in the first series of flops is determined from the inherent latency in obtaining the first columnar search result from the TCAM to which the address resolver 600 is coupled, e.g., one flop per clock cycle of inherent TCAM latency in obtaining a first search result. Therefore, the output 656 of the first series of flops, i.e., from the last flop 655-Z, goes high as the first TCAM match information is being received at the address resolver 600.

The output 656 from the first series of flops is coupled as a first input to AND gate 657, representing arrival of the first of N pipelined TCAM match information. A second series of flops, e.g., 658-2, 658-3, . . . , 658-N, each has their respective outputs coupled to AND gate 657. Thus, N−1 additional clock cycles after the first match information was pipelined to the address resolver (assuming subsequent compare cycles occur on successive clock cycles without gaps), all outputs of the second series of flops, e.g., 658-2, 658-3, . . . , 658-N, which are inputs to AND gate 657, will be high. Assuming at least one of the compare cycles of a TCAM search has produced a valid output, thus driving the output 659 of OR gate 660 high, the remaining input to AND gate 657 will be asserted, thus driving the MATCH_VALID output 670 of AND gate 657 high indicating the series of TCAM compares comprising a search sequence is complete. The then existing best match information is the best match information for the entire TCAM as explained below. The quantity of flops, N, represented by the second series of flops, e.g., 658-2, 658-3, . . . , 658-N, does correspond to the number, N, of columns (and the quantity of searches) into which the TCAM is defined for columnar searching. Both series of timing flops are reset by OR gate 653 (connections to individual flops not shown). The MATCH_VALID output 670 and !RESET_LOW, i.e., not RESET_LOW, signals are coupled as inputs to OR gate 653. Therefore, the timing flops are reset after a TCAM search is complete, i.e., MATCH_VALID 670 goes high, or on reset, i.e., not reset signal low.

As shown in FIGS. 6A and 6B, the selection portion 644 of the address resolver 600 includes signal connections to the TCAM for receiving two (2) pipelined match information signals per search, e.g., columnar search. These two signals are the most recent (new) TCAM match_address, e.g., NEW TMA 692 and corresponding new TCAM MATCH_VALID, e.g., NEW TMV 672. The connections between the address resolver and TCAM are also illustrated in FIGS. 2A, 3A, 3B, and 5.

The selection portion 644 of the address resolver 600 receives pipelined match information for each TCAM search, consisting of a best match address, e.g., digitally encoded TCAM address containing best match, and validity information, i.e., digital indication that the accompanying address is either valid or not valid. Match address may contain information identifying the column producing the search result, i.e., information to more specifically identify the word with an entry.

Validity signal processing is described first since a best match address is selected from only valid addresses pipelined to the address resolver 600. An invalid address, e.g., an address plus an invalid indication, can be pipelined from the TCAM to the address resolver 600 if no match is found during a search. The address resolver 600 receives match address validity information from the TCAM at the TCAM MATCH_VALID ("NEW TMV") input 672. As shown in FIGS. 6A and 6B, NEW TMV 672 is coupled as an inverted input to AND gates 674 and 676, and coupled as a direct input to AND gates 682 and 684. The output of flop 674, e.g., OLD VALID, is coupled to AND gates 674 and 682 as an inverted input, and to AND gates 676 and 684 as a direct input.

Flop 647 is initially reset to begin a new TCAM search as previously described. As match information is pipelined to the address resolver 600, the best valid match information thus far in a series of related searches is retained and compared to subsequent match information, with the best match information from these comparisons being continually updated and retained by the address resolver 600. This retained match information includes match validity information. NEW TMV 672 is coupled to one input of multiplexer 687, with the output of flop 674, e.g., OLD VALID 686, being coupled to another input of multiplexer 687. Details of the selection logic for multiplexer 687 are discussed below; however, through multiplexer 687, a selection is made between the latest valid information, e.g., NEW TMV 672, or the valid information corresponding to the best matching address from all of the previous match information pipelined thus far to the address resolver 600.

As shown in FIGS. 6A and 6B, the output of flop 647 is coupled as an inverted input to AND gates 674 and 682, and as a direct input to AND gates 676 and 684. The outputs of AND gates 674 and 676 are coupled to OR gate 678, which has an output of KEEP OLD 679. Thus, through AND gates 674 and 676, and OR gate 678, if the latest valid information pipelined to the address resolver 600 indicates an invalid match address, regardless of whether the retained validity information, e.g., OLD VALID 686, is valid yet (or still invalid from initialization with no valid matches received). The output of OR gate 678, e.g., KEEP OLD 679, is coupled to encoder 680, i.e., the selection logic for multiplexer 696, to select input 2 to pass the previously retained, i.e., old, address ("OLD ADDR").

As shown in FIG. 6B, if the latest valid information received at the address resolver, e.g., NEW TMV 672, indicates the latest address to be received at the address resolver is valid, and the retained valid information, e.g., OLD VALID 686, output from flop 647 still indicates an invalid retained address, i.e., from initialization without any subsequent valid match information, than AND gate 682 output, e.g., TAKE NEW 683, will be asserted. The output of AND gate 682 is coupled to encoder 680 to control selecting the new address at input 1 of multiplexer 696, e.g., "NEW ADDR." If the latest received match address is valid, e.g., NEW TMV 672, and the retained match address is valid, e.g., OLD VALID 686, then the output of AND gate 684 will be asserted, e.g., "COMPARE" 685. The output of AND gate 684 is coupled to encoder 680 to select a comparison address, e.g., "COMP ADDR," at input 0 of multiplexer 696.

Processing of the match addresses is illustrated principally in FIGS. 6A and 6B. Flop 649 in FIG. 6A is initially reset as previously described. The output of flop 649 represents the retained best match address, e.g., old TCAM match address ("OLD TMA"), pipelined from the TCAM in a series of related searches to the address resolver. The output of flop 649 is coupled to input 0 of comparator 691, and to input 0 of multiplexer 694. The other input to comparator 691 is the latest TCAM match address, e.g., NEW TMA 692, which is also the second input to multiplexer 694. According to one example embodiment of the present invention, comparator 691 determines if the latest received matching address, e.g., NEW TMA, is less than or equal to the previously best matching address, e.g., OLD TMA. This is a TCAM entry (row) address comparison, i.e., a priority determination in one (1) dimension only is needed since columns are being searched in priority order. If so, the output of comparator 691, e.g., USE NEW, which is coupled to multiplexer 694 as a selection input, is asserted to select the new match address, e.g., NEW TMA 692, as the best match address thus far. Otherwise, the output of comparator 691, e.g., USE NEW, is not asserted, and the old matching address, e.g., OLD TMA 651, is selected to pass through multiplexer 694 as the comparison address input 699, i.e., input 0, to multiplexer 696. The latest match address, e.g., NEW TMA 692, and the retained match address, e.g., OLD TMA 651, are also coupled to inputs 1 and 2 respectively of multiplexer 696.

Comparator 691 is configured to select the highest priority address from among its two inputs. The specific decision process for selecting the highest priority address, i.e., best match address, executed by comparator 691 is determined from the particular 2-dimensional priority scheme used to arrange data words in the TCAM, as well as the scope and order of searching the TCAM. For the embodiment of address resolver 600, with comparator 691, illustrated in FIG. 6B, data words are arranged in the associated TCAM in the 2-dimensional priority scheme depicted in FIG. 4, using over-down-over sub priority, and searching the TCAM using columnar searches from left to right, i.e., searches are from lower priority columns to higher priority columns. From the above-mentioned 2-dimensional priority scheme and increasing priority search scheme, match information pipelined later in time will be from higher priority columns; thus, the new match addresses will be from a higher priority column than any retained, i.e., old, match address. And since priority decreases as row number increases, a match address will be of higher priority in the 2-dimensional priority scheme if the match address from a higher priority column, e.g., NEW TMA, is in the same entry (row) number or lower, e.g., NEW TMA<=OLD TMA. Of course, if the TCAM is arranged in a different 2-dimensional priority scheme, or the search order is changed, the logic executed within comparator 691 needs to be modified to correctly select the highest priority match address.

Returning to the selection logic for multiplexer 687 shown in FIG. 6A. OR gate 689 drives selection of the new valid information, since the output of OR gate 689 is coupled to the selection input of multiplexer 687. When the output of OR gate 689 is asserted, input 1 of multiplexer 687 is selected, e.g., NEW TMV 672. The TAKE NEW 683 output from AND gate 682 is coupled to OR gate 689 as one input. The output of AND gate 690 is coupled to OR gate 689 as a second input. The output of AND gate 684, e.g., COMPARE 685, is coupled to AND gate 690 as a first input, and the output of comparator 691, e.g., USE NEW, is coupled to AND gate 690 as a second input. Therefore, if the new valid information is valid and the old valid information is not valid, then the TAKE NEW 683 output of AND gate 682 will be asserted through OR gate 689 causing the new valid information, e.g., NEW TMV 672 to be passed through multiplexer 687. Alternatively, if both the new and old validity information are valid, and the output of AND gate 684 calls for a comparison of retained (old), e.g., NEW TMA 692, and new, e.g., OLD TMA 651, match addresses to determine priority, and the output from comparator 691, e.g., USE NEW, is asserted indicating the new match address is of higher priority, then the output of AND gate 690 will be asserted, as will the output of OR gate 689, and the new valid information corresponding to the new (higher priority) match address, will be selected and passed through multiplexer 687 as the retained, i.e., updated old, validity information, e.g., OLD TMV 688.

As shown in FIG. 6B, the output of the address resolver 600 is the output of multiplexer 696, e.g., MATCH ADDRESS output 698. Multiplexer 696 selects either the retained (old) match address or the latest (new) match address based on corresponding invalidity of one or the other match address, or selects a comparison address (also either old or new) based on a priority determination between the two addresses when both addresses are valid. The output of multiplexer 696 is coupled to the input of flop 649, as shown in FIG. 6A. In this manner, the address selected by multiplexer 696 is retained, e.g., OLD TMA, for future comparisons.

As noted above, the reader will appreciate that various embodiments described herein can be performed by application specific integrated circuit (ASIC) logic, e.g., hardware in the form of transistor gates, etc., shown herein or otherwise. Unless explicitly stated, the methods of the various embodiments described herein are not constrained to a particular order or sequence. Additionally, some of the described methods of the various embodiments can occur or be performed at the same point in time.

Software, e.g., computer executable instructions, can be used to arrange words into entries, or select columnar portions of a CAM based on arrangement of words in an entry, or entries in a CAM to achieve searching efficiencies. There may be a tradeoff between the size of the words, e.g., the number of words in each entry (requiring more time to columnar search the entire CAM and less priority encoding capability with a smaller number of entries having more words in each entry), with the amount of priority encoding resources used to implement a larger parallel prioritizing logic for a larger number of entries. So too, there the additional administrative bit overhead, contributing to additional CAM storage requirements, needs to be balanced with the efficiencies of sequential columnar searching of a CAM.

Figure 7:
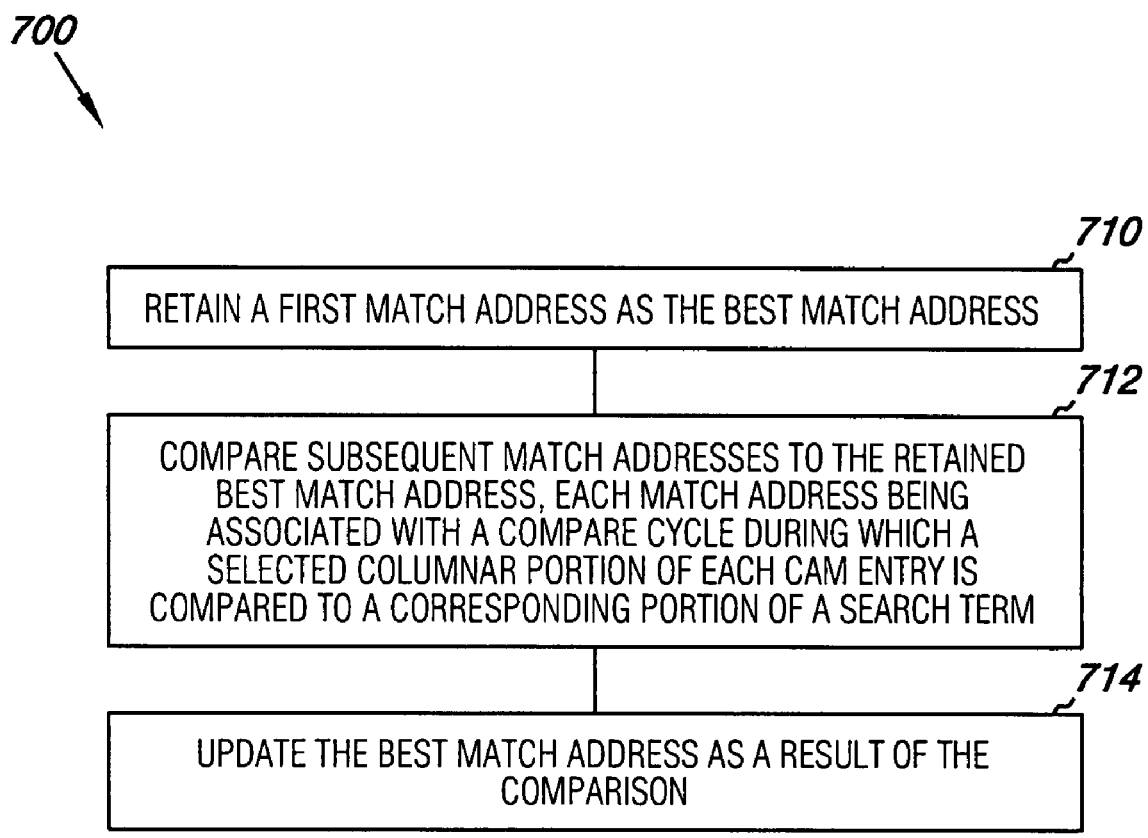
FIG. 7 illustrates a method embodiment for using a CAM, according to an embodiment of the present invention.

FIG. 7 illustrates a method which may be used in association with resolving content addressable memory (CAM) match address priority. The method includes retaining a first match address as the best match address, as shown at block 710. Block 712 illustrates comparing subsequent match addresses to the retained best match address, each match address being associated with a compare cycle during which a selected columnar portion of each CAM entry is compared to a corresponding portion of a search term. Block 714 illustrates updating the best match address as a result of the comparison.

The method described in connection with FIG. 7 can be present in whole or in part in embodiments of other Figures, e.g., in the arrangement of cells of FIG. 4, and within the address resolver circuitry of FIGS. 6A-D. Embodiments, however, are not limited to the example given herein.

It is to be understood that the above description has been made in an illustrative fashion, and not a restrictive one. Although specific embodiments have been illustrated and described herein, those of ordinary skill in the art will appreciate that other component arrangements and device logic can be substituted for the specific embodiments shown. The claims are intended to cover such adaptations or variations of embodiments of the present invention, except to the extent limited by the prior art.

In the foregoing Detailed Description, various features are grouped together in a single embodiment for the purpose of streamlining the disclosure. This method of disclosure is not to be interpreted as reflecting an intention that any claim requires more features than are expressly recited in the claim. Rather, as the following claims reflect, inventive subject matter lies in less than all features of a single disclosed embodiment. Thus, the following claims are hereby incorporated into the Detailed Description, with each claim standing on its own as a separate embodiment of the invention.

What is claimed:

1. A method for resolving content addressable memory (CAM) match address priority from a plurality of match addresses, comprising:

retaining a first match address of the plurality of match addresses as a best match address;

comparing subsequent match addresses of the plurality of match addresses to the retained best match address; and updating the best match address as a result of the comparison;

wherein each of the plurality of match addresses is associated with a compare cycle during which a selected columnar portion of a CAM entry is compared to a corresponding portion of a search term.

2. The method recited in claim 1, wherein the best match address is updated to a highest priority valid address based on a 2-dimensional priority scheme used to arrange data words in the CAM.

3. The method recited in claim 2, wherein the retained best match address has a lower priority in a first dimension than each subsequent match address, and comparing is limited to determining address priority in a second dimension.

4. The method recited in claim 1, wherein each of the plurality of match addresses corresponds to one of N compare cycles of a CAM search, each compare cycle having a different one of the N columnar portions selected as being permitted to discharge pre-charged match lines.

5. The method recited in claim 4, wherein comparing subsequent match addresses to the retained best match address includes a comparison of associated match validity information.

6. A method for resolving content addressable memory (CAM) priority from a plurality of match information, comprising:

retaining as best match information, first match information of the plurality of match information from a first compare cycle corresponding to a first of N columns of data words in the CAM;

receiving one at a time, new match information from a series of N compare cycles, each compare cycle corresponding to a different one of N sequentially-selected columns;

replacing the best match information with the new match information from at least one of the N compare cycles when the best match information meets a criteria selected from the group consisting of:

includes an invalid match address, and includes a valid match address having a lower priority in a first dimension than a valid match address included in the new match information from the at least one of the N compare cycles; and wherein columns are selected in a sequence from lowest to highest priority in a second dimension.

7. The method recited in claim 6, wherein the method includes indicating the best match information is a final result after the new match information for N−1 compare cycles of the series of N compare cycles has been received an N−1th times.

8. The method recited in claim 6, wherein the method includes indicating the best match information is a final result after a delay of N−1 clock cycles following receipt of the first match information.

9. The method recited in claim 6, wherein the method includes discarding any new match information including an invalid match address when the best match information includes a valid match address.

10. The method recited in claim 6, wherein match address information includes CAM row and column identification.

11. The method recited in claim 6, wherein priority in a first and second dimension correspond to a 2-dimensional priority scheme used to arrange the data words in the CAM.

12. The method recited in claim 6, wherein validity corresponding to each data word of a CAM entry are encoded into the CAM entry.

13. The method recited in claim 6, wherein a configuration of a CAM entry is encoded into the CAM.

14. A content addressable memory (CAM) system, comprising:
- a CAM having multiple entries;
- a priority encoder coupled to receive match information from the CAM; and
- an address resolver arranged to receive a plurality of match addresses pipelined from the priority encoder, and having logic configured to:
  - retain a first match address of the plurality of match addresses as a best match address;
  - compare subsequent match addresses of the plurality of match addresses to the retained best match address; and
  - update the best match address as a result of the comparison;
- wherein each match address of the plurality of match addresses is associated with a compare cycle during which a selected columnar portion of each CAM entry is compared to a corresponding portion of a search term.

15. The CAM system recited in claim 14, wherein the logic is configured to update the best match address to a highest priority valid address based on a 2-dimensional priority scheme used to arrange data words in the CAM.

16. The CAM system recited in claim 14, wherein the retained best match address is updated with one of the subsequent match addresses when the retained best match address has a lower priority in a first dimension than the one subsequent match address, and comparing is limited to determining address priority in a second dimension.

17. The CAM system recited in claim 14, wherein each of the plurality of match addresses is a highest priority match address corresponding to one of N compare cycles of a CAM search during which a different selected columnar portion of each CAM entry is permitted to determine mis-matches.

18. The CAM system recited in claim 14, wherein the logic is configured to indicate the updated best match address as a final best match address after N compare cycles.

19. The CAM system recited in claim 14, wherein the logic is configured to indicate the best match address as a final best match address after a time delay of N−1 clock cycles following receipt of the first match address.

20. The CAM system recited in claim 19, wherein the time delay is programmable based on the address resolver receiving an input of the quantity, N, columnar portions in the CAM.

* * * * *